(12) United States Patent
Kim et al.

(10) Patent No.: US 11,973,028 B2
(45) Date of Patent: Apr. 30, 2024

(54) REDISTRIBUTION SUBSTRATE, METHOD OF FABRICATING THE SAME, AND SEMICONDUCTOR PACKAGE INCLUDING THE SAME

(71) Applicant: SAMSUNG ELECTRONICS CO., LTD., Suwon-si (KR)

(72) Inventors: Jongyoun Kim, Seoul (KR); Seokhyun Lee, Hwaseong-si (KR); Minjun Bae, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/105,945

(22) Filed: Feb. 6, 2023

(65) Prior Publication Data
US 2023/0187345 A1 Jun. 15, 2023

Related U.S. Application Data

(63) Continuation of application No. 17/189,964, filed on Mar. 2, 2021, now Pat. No. 11,600,564, which is a
(Continued)

(30) Foreign Application Priority Data

Sep. 13, 2018 (KR) .......................... 10-2018-0109695

(51) Int. Cl.
*H01L 23/00* (2006.01)
*H01L 21/56* (2006.01)
(Continued)

(52) U.S. Cl.
CPC ........ *H01L 23/5226* (2013.01); *H01L 21/565* (2013.01); *H01L 21/76819* (2013.01);
(Continued)

(58) Field of Classification Search
CPC ............ H01L 23/5226; H01L 23/3128; H01L 23/5283; H01L 23/49816; H01L 23/481;
(Continued)

(56) References Cited

U.S. PATENT DOCUMENTS 7,582,556 B2 9/2009 Lin et al.
7,648,902 B2 1/2010 Lu
(Continued)

FOREIGN PATENT DOCUMENTS

CN 1681117 A 10/2005
CN 101286456 A 10/2008
(Continued)

OTHER PUBLICATIONS

Communication dated Mar. 25, 2021 issued by the Indian Patent Office in counterpart Indian Application No. 201944032277.

*Primary Examiner* — Dao H Nguyen
(74) *Attorney, Agent, or Firm* — Sughrue Mion, PLLC

(57) ABSTRACT

A method is provided and includes forming a first conductive pattern; forming a photosensitive layer on the first conductive pattern, the photosensitive layer having a first through hole exposing a portion of the first conductive pattern; forming a first via in the first through hole; removing the photosensitive layer; forming a dielectric layer encapsulating the first conductive pattern and the first via, the dielectric layer exposing a top surface of the first via; forming a second conductive pattern on the top surface of the first via, forming a dielectric layer covering the second conductive pattern; etching the dielectric layer to form a second through hole that exposes a portion of the second conductive pattern; forming a second via filling the second through hole and an under bump pad on the second via; and mounting a semiconductor chip on the under bump pad using a connection terminal.

20 Claims, 14 Drawing Sheets

Related U.S. Application Data continuation of application No. 16/351,709, filed on Mar. 13, 2019, now Pat. No. 10,950,539.

(51) Int. Cl.
*H01L 21/768* (2006.01)
*H01L 23/31* (2006.01)
*H01L 23/522* (2006.01)
*H01L 23/528* (2006.01)

(52) U.S. Cl.
CPC .. *H01L 21/76871* (2013.01); *H01L 21/76877* (2013.01); *H01L 23/3128* (2013.01); *H01L 23/5283* (2013.01); *H01L 24/09* (2013.01); *H01L 24/17* (2013.01); *H01L 2224/0231* (2013.01); *H01L 2224/02373* (2013.01); *H01L 2224/02381* (2013.01); *H01L 2224/0401* (2013.01)

(58) Field of Classification Search
CPC ......... H01L 21/76819; H01L 21/76871; H01L 21/76877; H01L 21/76804; H01L 24/17; H01L 24/13; H01L 24/16; H01L 2224/0231; H01L 2224/02373; H01L 2224/0401

See application file for complete search history.

(56) References Cited

U.S. PATENT DOCUMENTS

| | | | |
|---|---|---|---|
| 7,830,011 B2 | 11/2010 | Nomoto et al. | |
| 7,902,660 B1 | 3/2011 | Lee et al. | |
| 7,915,088 B2 | 3/2011 | Kobayashi et al. | |
| 8,389,406 B2 | 3/2013 | Sameshima et al. | |
| 8,846,548 B2 | 9/2014 | Tu et al. | |
| 9,449,913 B2 | 9/2016 | Lee et al. | |
| 9,721,886 B2 | 8/2017 | Lee et al. | |
| 10,177,012 B2 | 1/2019 | Kodani | |
| 10,262,958 B2 | 4/2019 | Yang et al. | |
| 10,950,539 B2 | 3/2021 | Kim et al. | |
| 2001/0020737 A1 | 9/2001 | Kwon et al. | |
| 2004/0168825 A1* | 9/2004 | Sakamoto | H01L 25/03 257/E23.179 |
| 2008/0081458 A1 | 4/2008 | Lin et al. | |
| 2008/0121943 A1 | 5/2008 | Lin et al. | |
| 2009/0231827 A1* | 9/2009 | Furutani | H01L 23/49827 216/17 |
| 2013/0026650 A1 | 1/2013 | Yamagata et al. | |
| 2015/0264817 A1 | 9/2015 | Terui et al. | |
| 2017/0062368 A1 | 3/2017 | Jung et al. | |
| 2017/0110421 A1 | 4/2017 | Liu et al. | |
| 2017/0330767 A1 | 11/2017 | Kang et al. | |
| 2017/0338128 A1 | 11/2017 | Huang et al. | |
| 2018/0005931 A1 | 1/2018 | Chen et al. | |
| 2018/0076184 A1 | 3/2018 | Chen et al. | |
| 2018/0122732 A1 | 5/2018 | Kuo et al. | |
| 2018/0174954 A1 | 6/2018 | Lu et al. | |
| 2019/0131235 A1* | 5/2019 | Wang | H01L 21/76885 |
| 2019/0304803 A1 | 10/2019 | Hu et al. | |
| 2020/0185314 A1* | 6/2020 | Kim | H05K 1/11 |
| 2022/0077048 A1* | 3/2022 | Suk | H01L 21/4857 |

FOREIGN PATENT DOCUMENTS

| | | |
|---|---|---|
| CN | 103915374 A | 7/2014 |
| CN | 104253053 A | 12/2014 |
| EP | 3 012 862 A1 | 4/2016 |
| JP | 2005-310841 A | 11/2005 |
| JP | 4668938 B2 | 4/2011 |
| JP | 4686962 B2 | 5/2011 |
| JP | 2011-171614 A | 9/2011 |
| JP | 2014086525 A | 5/2014 |
| JP | 2018073849 A | 5/2018 |
| KR | 10-2005-0010262 A | 1/2005 |

* cited by examiner

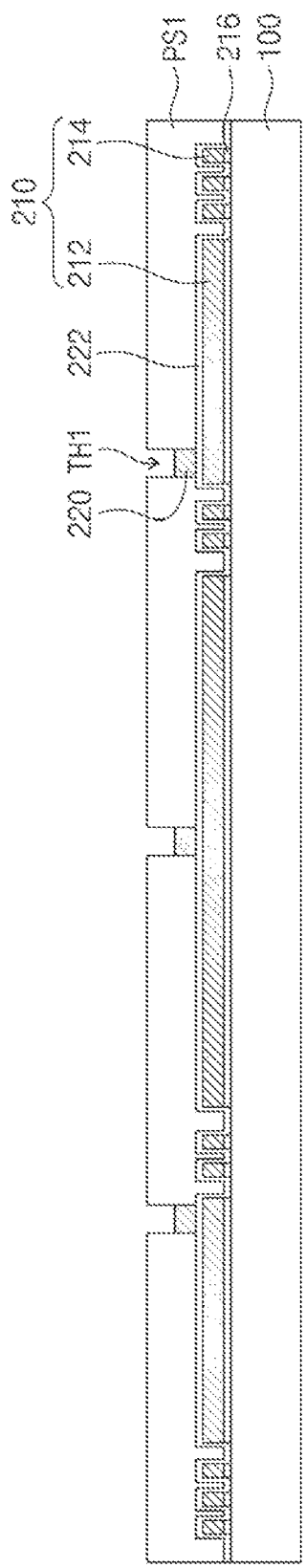
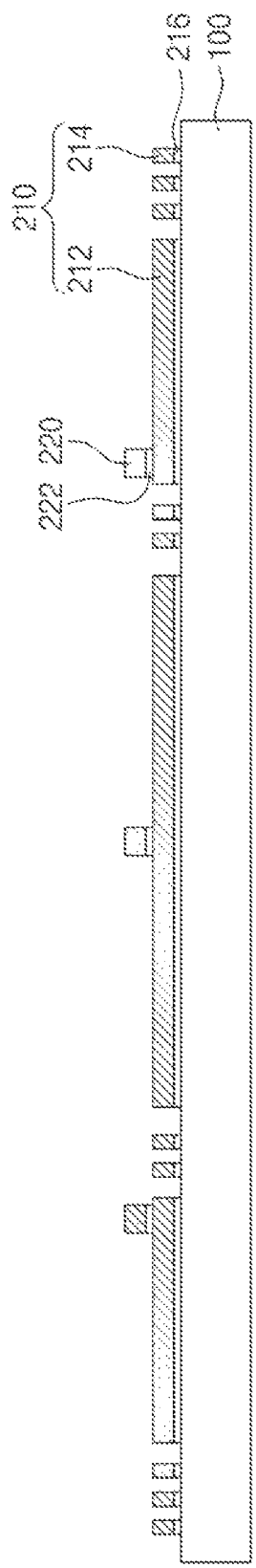

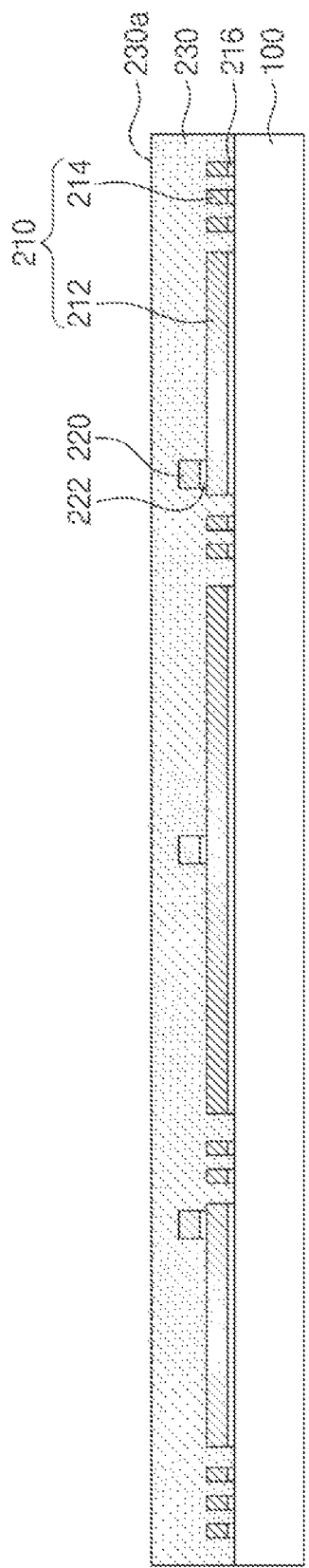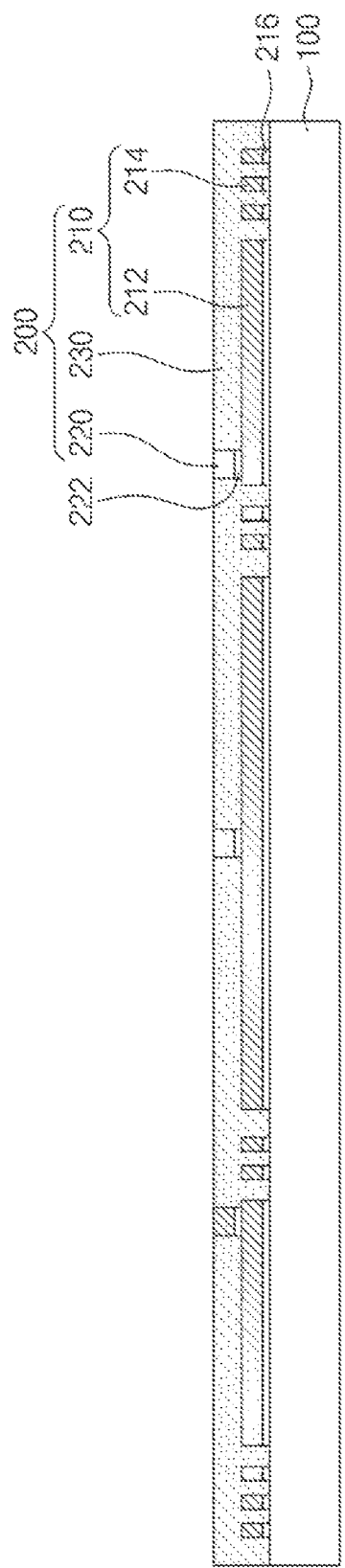

REDISTRIBUTION SUBSTRATE, METHOD OF FABRICATING THE SAME, AND SEMICONDUCTOR PACKAGE INCLUDING THE SAME

CROSS-REFERENCE TO RELATED APPLICATION

This application is a Continuation of U.S. application Ser. No. 17/189,964, filed on Mar. 2, 2021, which is a Continuation of U.S. application Ser. No. 16/351,709, filed on Mar. 13, 2019 (now U.S. Pat. No. 10,950,539), which claims priority under 35 U.S.C § 119 to Korean Patent Application No. 10-2018-0109695 filed on Sep. 13, 2018 in the Korean Intellectual Property Office, the entire contents of each of which are hereby incorporated by reference.

BACKGROUND

1. Field

The present inventive concepts relate to a redistribution substrate, a method of fabricating the same, and a semiconductor package including the same.

2. Description of Related Art

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the development of the electronic industry, electronic products have increasing demands for high performance, high speed, and compact size.

A size of the semiconductor chip becomes smaller with high integration of the semiconductor chip. The scaling down of the semiconductor chip leads to difficulty in forming a desirable number of connection lines. A wafer level package and a panel level package are provided to meet the trend mentioned above.

SUMMARY

It is an aspect to provide a redistribution substrate with increased integration, a method of fabricating the same, and a semiconductor package including the same.

It is another aspect to provide a redistribution substrate with enhanced electrical characteristics, a method of fabricating the same, and a semiconductor package including the same.

Aspects are not limited to the mentioned above, and other aspects which have not been mentioned above will be clearly understood to those skilled in the art from the following description.

According to an aspect of one or more example embodiments, there is provided a method of fabricating a redistribution substrate including forming a first conductive pattern; forming a first photosensitive layer on the first conductive pattern, the first photosensitive layer having a first through hole exposing a first portion of the first conductive pattern; forming a first via in the first through hole; removing the first photosensitive layer; forming a first dielectric layer that encapsulates the first conductive pattern and the first via, the first dielectric layer exposing a top surface of the first via; and forming a second conductive pattern on the top surface of the first via.

According to another aspect of one or more example embodiments, there is provided a redistribution substrate including a first conductive pattern; a first via connected to a first top surface of the first conductive pattern; a second conductive pattern on the first via, the second conductive pattern including a second conductive pattern pad connected to the first via, and a plurality of connection lines spaced apart from the second conductive pattern pad; a second via connected to a second top surface of the second conductive pattern pad; and an under bump pad on the second via, wherein a first angle between a first lateral surface of the first via and the first top surface of the first conductive pattern is greater than a second angle between a second lateral surface of the second via and the second top surface of the second conductive pattern pad.

According to another aspect of one or more example embodiments, there is provided a semiconductor package including a first conductive pattern and a second conductive pattern that are vertically spaced apart from each other in a dielectric layer; a plurality of first vias that connect the first conductive pattern and the second conductive pattern to each other; a plurality of second vias on the second conductive pattern; a plurality of under bump pads on the dielectric layer and connected to the plurality of second vias, respectively; and a semiconductor chip mounted on the plurality of under bump pads, wherein each of the plurality of first vias has a pillar shape whose first via width is uniform, and wherein each of the plurality of second vias has a tapered shape whose second via width increases with increasing distance from the second conductive pattern.

According to another aspect of one or more example embodiments, there is provided a redistribution substrate including a first connection line layer comprising a first pad, and a first via connected to a top surface of the first pad, the first via having a uniform width; a second connection line layer comprising a second pad connected to a top surface of the first via, a plurality of connection lines spaced apart from the second pad, and a second via connected to a top surface of the second pad, a second via width of the second via increasing as a distance from the second pad increases; and an under bump pad on the second via.

BRIEF DESCRIPTION OF THE DRAWINGS

FIGS. 7 to 17 illustrate cross-sectional views showing a method of fabricating a redistribution substrate according to some example embodiments.

DETAILED DESCRIPTION

Figure 1:
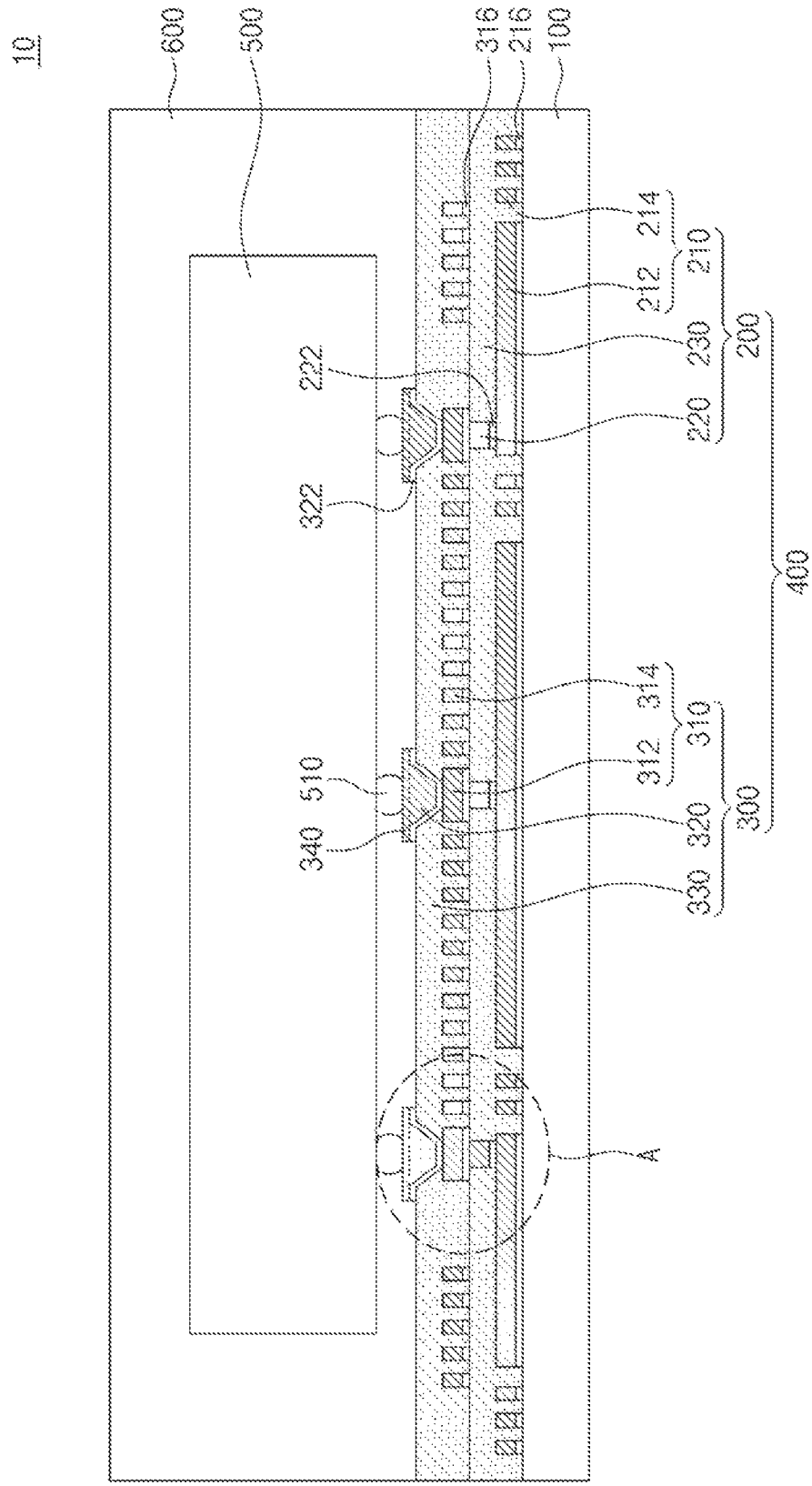
FIG. 1 illustrates a cross-sectional view showing a semiconductor package according to some example embodiments.
Figure 2:
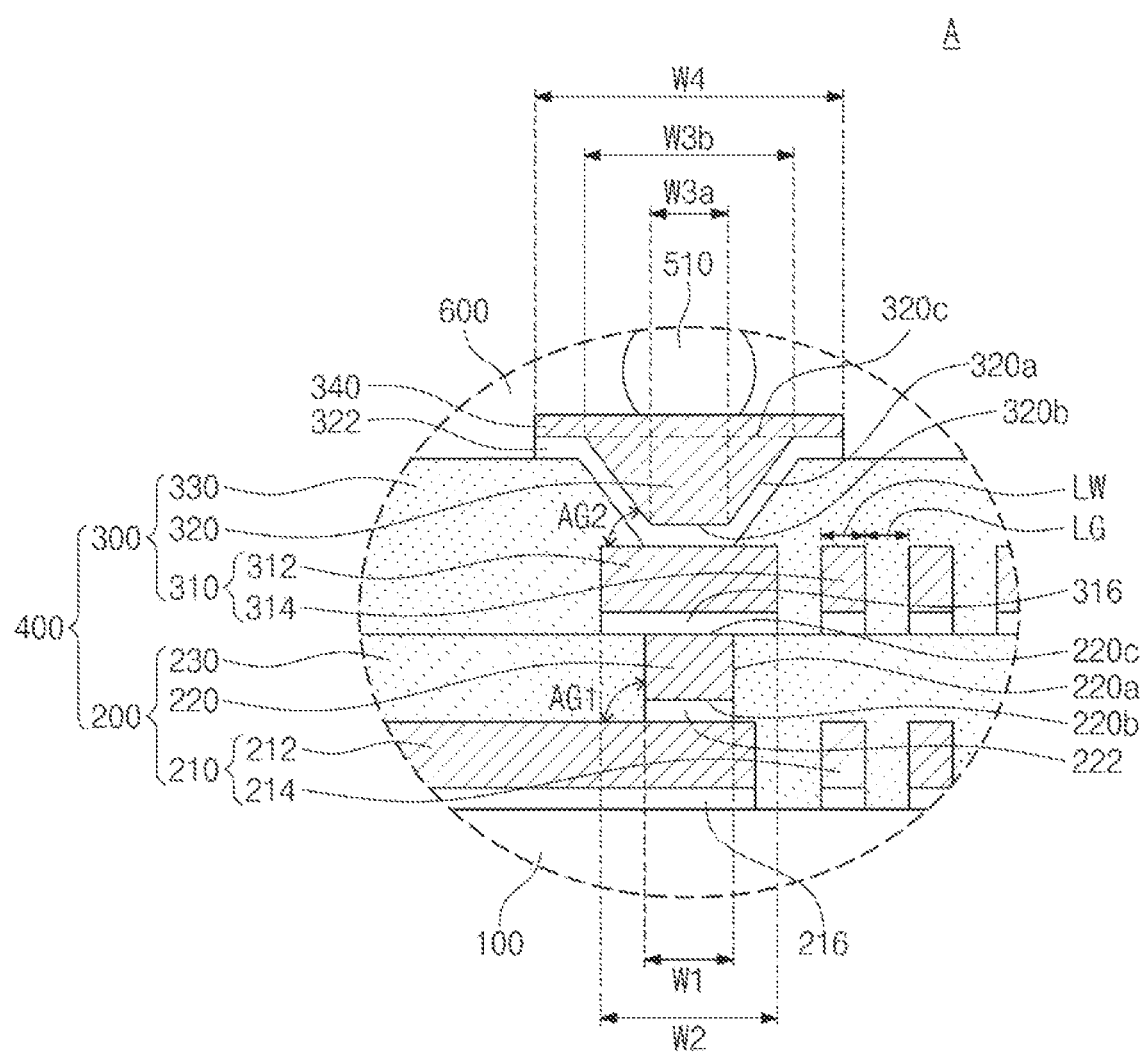
FIG. 2 illustrates an enlarged view showing a section A of the semiconductor package of FIG. 1.

The following will now describe a redistribution substrate and a semiconductor package with reference to the accompanying drawings. FIG. 1 illustrates a cross-sectional view showing a semiconductor package according to some example embodiments. FIG. 2 illustrates an enlarged view showing section A of the semiconductor package of FIG. 1.

Referring to FIG. 1, a semiconductor package 10 according to some example embodiments may include a redistribution substrate 400, a semiconductor chip 500, and a molding layer 600.

The redistribution substrate 400 may be provided on a bottom surface of the semiconductor chip 500 and a bottom surface of the molding layer 600. The redistribution substrate 400 may have a thickness less than that of the semiconductor chip 500. The redistribution substrate 400 may include at least one connection line layer. The connection line layer may be provided in plural. In certain embodiments, the redistribution substrate 400 may include a first connection line layer 200 and a second connection line layer 300. The following will describe in detail the redistribution substrate 400 with reference to FIGS. 1 and 2.

Referring to FIGS. 1 and 2, a support substrate 100 may be provided. The support substrate 100 may include a silicon substrate or a dielectric substrate. However, in some embodiments, a support substrate 100 may be omitted as needed.

The first connection line layer 200 may be provided on the support substrate 100. The first connection line layer 200 may include a first conductive pattern 210, first vias 220, and a first dielectric layer 230.

The first conductive pattern 210 may be provided on the support substrate 100. The first conductive pattern 210 may include first pads 212 and first connection lines 214. In this description, the first connection lines 214 may extend in a direction parallel to a top surface of the support substrate 100 and may be defined as components that constitute an electrical circuit, and the first pads 212 may be formed to have widths that are greater than the widths of the first connection lines 214 and may be defined as components to which the first connection lines 214 and the first vias 220 are coupled. The first connection lines 214 may be placed either between the first pads 212 or on sides of the first pads 212. The first connection lines 214 may be electrically connected to the first pads 212. In this description, the phrase "electrically connected/coupled to" may include "directly or indirectly electrically connected/coupled to." The first conductive pattern 210 may include a conductive material. For example, the first conductive pattern 210 may include copper (Cu), aluminum (Al), or a copper alloy.

A first seed layer 216 may be provided between the first conductive pattern 210 and the support substrate 100. The first seed layer 216 may include copper (Cu). The first seed layer 216 may have a thickness of about 5 Å to about 50 Å.

The first vias 220 may be disposed on the first conductive pattern 210. For example, the first vias 220 may be disposed on a top surface of at least one of the first pads 212. In this description, the first vias 220 may be defined as components that vertically connect the first conductive pattern 210 in the first connection line layer 200 to a second conductive pattern 310, which will be discussed below, in the second connection line layer 300. As shown in FIG. 2, the first vias 220 may have their lateral surfaces 220a disposed at a first angle AG1 relative to the top surfaces of the first pads 212, which first angle AG1 may be about 90°. The lateral surfaces 220a of the first vias 220 may be substantially perpendicular to a top surface of the first conductive pattern 210. Each of the first vias 220 may have a pillar shape whose width W1 is uniform. The width W1 of each of the first vias 220 may be about 2 μm to about 8 μm. For example, the width W1 of each of the first vias 220 may be about 5 μm. The first vias 220 may be electrically connected through the first pads 212 to the first connection lines 214. The first vias 220 may include a conductive material. For example, the first vias 220 may include copper (Cu), aluminum (Al), or a copper alloy.

A second seed layer 222 may be provided between the first conductive pattern 210 and each of the first vias 220. The second seed layer 222 may contact a bottom surface 220b of each of the first vias 220, and may not cover the lateral surfaces 220a of each of the first vias 220. The second seed layer 222 may include copper (Cu). The second seed layer 222 may have a thickness of about 5 Å to about 50 Å.

The first dielectric layer 230 may be provided on the support substrate 100. The first dielectric layer 230 may cover the first conductive pattern 210 and may surround the first vias 220. The first dielectric layer 230 may contact the lateral surfaces 220a of the first vias 220 and lateral surfaces of the second seed layers 222. The first dielectric layer 230 may have a top surface coplanar with top surfaces 220c of the first vias 220. The first dielectric layer 230 may include a curable material. The first dielectric layer 230 may thus be cured by heat or light. The curable material may include but not limited to a polyamide-based polymer and/or an inorganic material such as silicon oxide, silicon nitride, and silicon oxynitride. For example, the curable material may include one or more of photosensitive polyimide (PSPI), polybenzoxazole (PBO), phenolic polymer, benzocyclobutene (BCB) polymer, and epoxy polymer.

Returning to FIG. 1, the second connection line layer 300 may be provided on the first connection line layer 200. The second connection line layer 300 may include a second conductive pattern 310, second vias 320, and a second dielectric layer 330.

The second conductive pattern 310 may be provided on the first connection line layer 200. The second conductive pattern 310 may include second pads 312 and second connection lines 314. In this description, the second connection lines 314 may extend in a direction parallel to a top surface of the first connection line layer 200 and may be defined as components that constitute an electrical circuit, and the second pads 312 may be formed to have widths that are greater than widths of the second connection lines 314 and may be defined as components to which the second connection lines 314 and the second vias 320 are coupled. Certain ones of the second pads 312 may be disposed on and coupled to the first vias 220. As shown in FIG. 2, each of the second pads 312 may have a width W2 greater than the width W1 of each of the first vias 220. For example, the width W2 of each of the second pads 312 may be 1 to 2 times the width W1 of each of the first vias 220. The width W2 of each of the second pads 312 may be about 2 μm to about 15 μm. For example, in some embodiments, the width W2 of each of the second pads 312 may be from about 2 μm to about 10 μm. The second pads 312 may protrude beyond the lateral surfaces 220a of the first vias 220. For example, the second pad 312 and the first via 220 may be integrally coupled to constitute a T-shaped cross-section. For another example, the second pad 312 and the first via 220 may be integrally coupled to constitute a bolt-like shape. The second pads 312 may be electrically connected through the first vias 220 to the first pads 212. The second connection lines 314 may be provided on the first dielectric layer 230. When viewed in plan, the second connection lines 314 may be placed either between the second pads 312 or on sides of the second pads 312. Eight to fifteen second connection lines 314 may be disposed between the second pads 312. For example, in the embodiment shown in FIG. 1, eleven second connection lines 314 may be provided between the second pads 312. As shown in FIG. 2, each of the second connection lines 314 may have a width LW of about 1 µm to about 3 µm. For example, between the second pads 312, the width LW of each of the second connection lines 314 may be about 2 µm. The second connection lines 314 may be spaced apart from each other at an interval LG of about 1 µm to about 3 µm. For example, the second connection lines 314 may be spaced apart from each other at the interval LG of about 2 µm. The second connection lines 314 may serve as redistribution lines. The second connection lines 314 may be electrically connected to the second pads 312. The second conductive pattern 310 may include a conductive material. For example, the second conductive pattern 310 may include copper (Cu), aluminum (Al), or a copper alloy.

A third seed layer 316 may be provided between the second conductive pattern 310 and the first dielectric layer 230 and between the second conductive pattern 310 and the first via 220. For example, the third seed layer 316 may be provided on a bottom surface of the second conductive pattern 310. The third seed layer 316 may include copper (Cu). The third seed layer 316 may have a thickness of about 5 Å to about 50 Å.

The second vias 320 may be disposed on the second conductive pattern 310. The second vias 320 may be correspondingly disposed on top surfaces of the second pads 312. In this description, the second vias 320 may be defined as components that vertically connect the second conductive pattern 310 in the second connection line layer 300 to under bump pads 340 which will be discussed below. As shown in FIG. 2, the second vias 320 may have their lateral surfaces 320a that are disposed at a second angle AG2 relative to the top surfaces of the second pads 312, which second angle AG2 may be less than the first angle AG1 between the lateral surfaces 220a of the first vias 220 and the top surfaces of the first pads 212. For example, the second angle AG2 may be an acute angle less than about 90°. The lateral surfaces 320a of the second vias 320 may be inclined with respect to a top surface of the second conductive pattern 310. For example, each of the second vias 320 may have a tapered shape whose width increases with increasing distance from the second conductive pattern 310. Each of the second vias 320 may have a bottom surface 320b and a top surface 320c. A width W3b of the top surface 320c may be 2 to 4 times a width W3a of the bottom surface 320b. The width W3a of the bottom surface 320b of each of the second vias 320 may be equal to or greater than the width W1 of each of the first vias 220. The width W3a of the bottom surface 320b of each of the second vias 320 may be about 2 µm to about 8 µm. For example, the width W3a of the bottom surface 320b of each of the second vias 320 may be about 5 µm. The second vias 320 may be electrically connected through the second pads 312 to the second connection lines 314. The second vias 320 may include a conductive material.

The second dielectric layer 330 may be provided on the first connection line layer 200. The second dielectric layer 330 may cover the second conductive pattern 310 and may surround the second vias 320. The second dielectric layer 330 may contact lateral surfaces of the second conductive pattern 310. The top surfaces 320c of the second vias 320 may be located at a higher level than that of a top surface of the second dielectric layer 330. The second dielectric layer 330 may include a curable material. The curable material may include but not limited to a polyamide-based polymer and/or an inorganic material such as silicon oxide, silicon nitride, and silicon oxynitride.

Under bump pads 340 may be disposed on the top surfaces 320c of the second vias 320. The under bump pads 340 may be formed to have widths greater than widths of the second vias 320, and may be defined as components to which are coupled the second vias 320 and connection terminals 510, which will be discussed below, of the semiconductor chip 500. As shown in FIG. 2, each of the under bump pads 340 may have a width W4 greater than that of the second pad 312. The width W4 of each of the under bump pads 340 may be greater than the width W3b of the top surface 320c of each of the second vias 320. The width W4 of each of the under bump pads 340 may be about 1.5 to 3 times the width W3b of the top surface 320c of each of the second vias 320. The under bump pad 340 and the second via 320 may be integrally connected into a single body. The under bump pads 340 may include, for example, the same material as that of the second vias 320. The under bump pads 340 may include a conductive material.

In the first dielectric layer 230, the first conductive pattern 210 may include circuits (e.g., the first connection lines 214 and the first pads 212) extending in a direction parallel to the top surface of the first dielectric layer 230, and in the second dielectric layer 330, the second conductive pattern 310 may include circuits (e.g., the second connection lines 314 and the second pads 312) extending in a direction parallel to the top surface of the second dielectric layer 330. The first vias 220 may vertically connect the first conductive pattern 210 to the second conductive pattern 310, and vertically connect the second conductive pattern 310 to the under bump pads 340.

According to the example embodiment shown in FIGS. 1 and 2, because each of the first vias 220 has a pillar shape whose width W1 is uniform, each of the first vias 220 may have a small width at its top surface 220c, and the second pads 312 may be easily formed to have small widths on corresponding first vias 220. In addition, the under bump pad 340 and the second pad 312 may be vertically spaced apart from each other across the second via 320 whose shape is tapered. In this case, because each width W4 of the under bump pads 340 is greater than each width W2 of the second pads 312, an under bump pad interval between the under bump pads 340 may be less than a second pad interval between the second pads 312. When the second pads 312 are arranged at the same pitch as that of the under bump pads 340, a wider interval may be provided between the second pads 312 as compared to the interval between the under bump pads 340, and thus a greater number of the second connection lines 314 may be disposed between the second pads 312. For example, the redistribution substrate 400 may have a high density of the second connection lines 314, and may have a smaller area used for forming the same number of connection lines (e.g., the second connection lines 314) rather than in related art cases.

A fourth seed layer 322 may be provided between the second conductive pattern 310 and each of the second vias 320. The fourth seed layer 322 may extend along the lateral surfaces 320a of the second via 320 from the bottom surface 320b of the second via 320 toward a gap between the second dielectric layer 330 and the under bump pad 340, as shown in FIG. 2. For example, the fourth seed layer 322 may separate the second dielectric layer 330 from the second via 320 and the under bump pad 340. According to the present inventive concepts, the redistribution substrate 400 may be provided as discussed above.

Referring back to FIG. 1, the semiconductor chip 500 may be placed on a top surface of the redistribution substrate 400. The semiconductor chip 500 may have a bottom surface or an active surface that faces the redistribution substrate 400. The semiconductor chip 500 may include silicon (Si). The semiconductor chip 500 may be flip-chip bonded to the redistribution substrate 400. For example, the semiconductor chip 500 may have connection terminals 510 on the bottom surface thereof. The connection terminals 510 may be coupled to the under bump pads 340 of the redistribution substrate 400. The connection terminals 510 may include solder balls or solder bumps. The semiconductor chip 500 may be electrically connected to the second connection lines 314 through the under bump pads 340 and the second vias 320 of the redistribution substrate 400. The redistribution substrate 400 may use the second connection lines 314 to redistribute the connections of the semiconductor chip 500.

The molding layer 600 may be provided on the redistribution substrate 400. On the top surface of the redistribution substrate 400, the molding layer 600 may encapsulate the semiconductor chip 500. For example, the molding layer 600 may cover top and lateral surfaces of the semiconductor chip 500. The molding layer 600 may fill a gap between the semiconductor chip 500 and the redistribution substrate 400. The molding layer 600 may include a dielectric material such as an epoxy-based polymer. Alternatively, an under-fill member may fill the gap between the semiconductor chip 500 and the redistribution substrate 400.

According to the example embodiment shown in FIGS. 1-2, the semiconductor package 10 may include the redistribution substrate 400 having a high density of connection lines. Therefore, the semiconductor package 10 may increase in integration and decrease in size.

Figure 3:
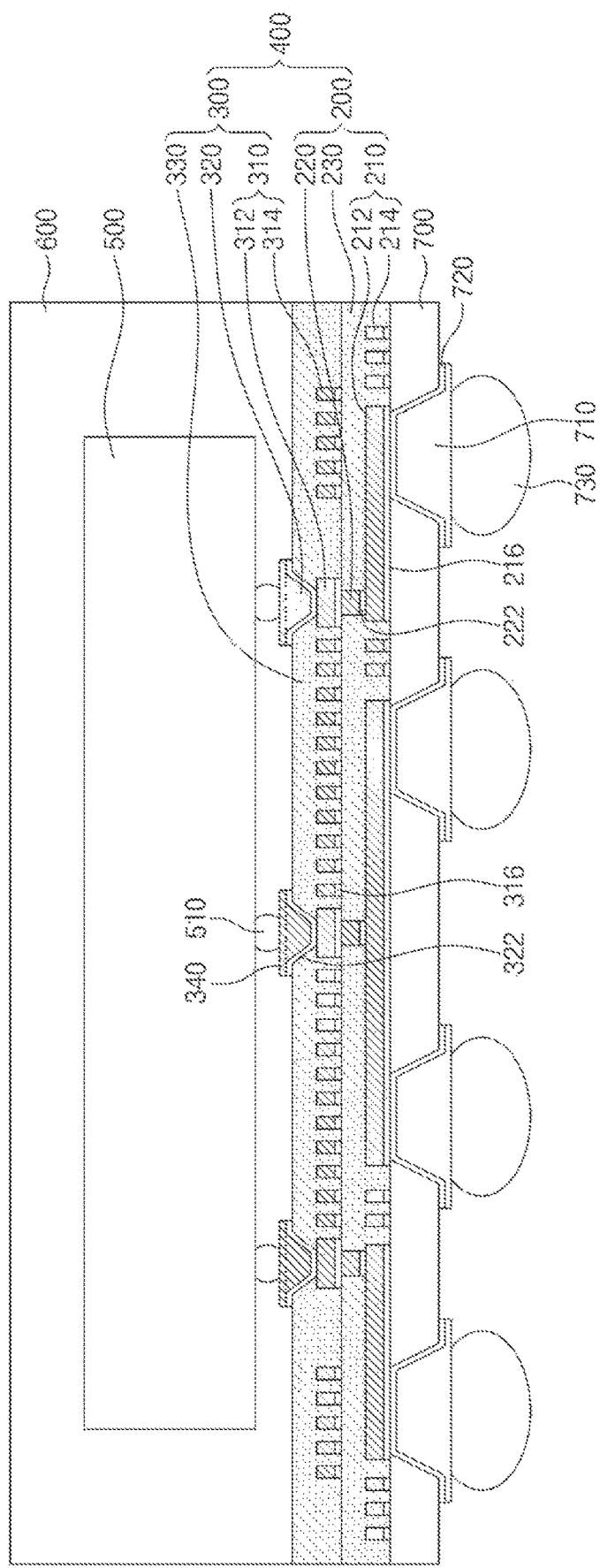
FIG. 3 illustrates a cross-sectional view showing a semiconductor package according to some example embodiments.

In other embodiments, the redistribution substrate 400 may be provided with external terminals 730 below the first connection line layer 200. FIG. 3 illustrates a cross-sectional view showing a semiconductor package according to some example embodiments.

Referring to FIG. 3, the redistribution substrate 400 may be provided on its bottom surface with a passivation layer 700 instead of the support substrate (see 100 of FIG. 1). The passivation layer 700 may include an organic material, an inorganic material, an ajinomoto build-up film (ABF), or a dielectric polymer such as an epoxy-based polymer. External terminals 730 may be disposed on a bottom surface of the passivation layer 700. The external terminals 730 may be disposed on external pads 710 that penetrate the passivation layer 700 and connect with the first conductive pattern 210. The external terminals 730 may be electrically connected through the external pads 710 to the first pads 212 of the redistribution substrate 400. A barrier metal layer 720 may be provided between the passivation layer 700 and each of the external pads 710. For example, the passivation layer 700 may have recesses that expose the first pads 212, and the barrier metal layer 720 may cover a bottom surface and an inner wall of the recess. The barrier metal layer 720 may be provided thereon with the external pad 710 filling the recess. The external terminals 730 may include solder balls or solder bumps. The external pads 710 may include metal such as copper (Cu). The barrier metal layer 720 may include one or more of Ta, TaN, TaSiN, Ti, TiN, TiSiN, W, and WN. The barrier metal layer 720 may have a thickness of about 5 Å to about 50 Å.

Figure 4:
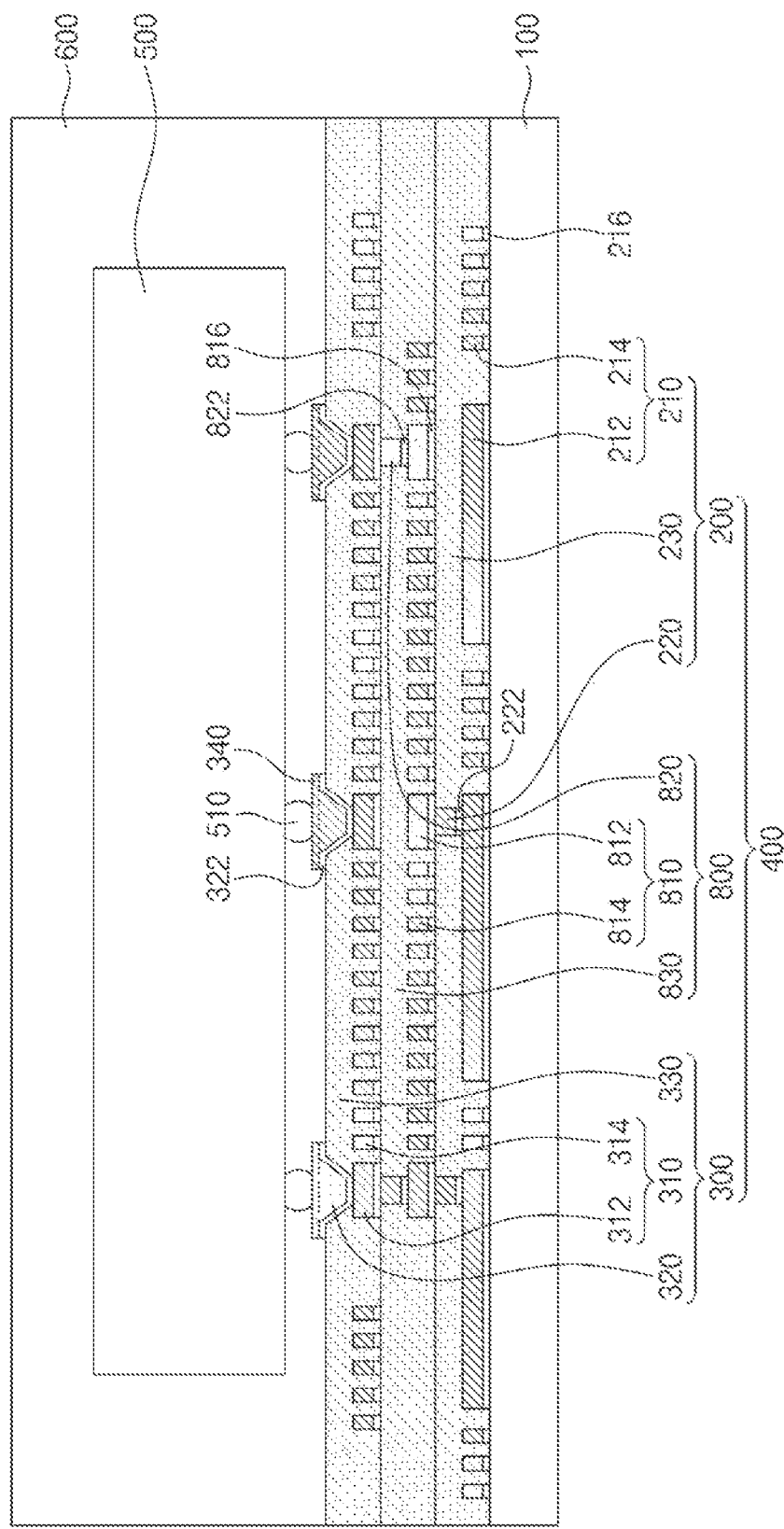
FIG. 4 illustrates a cross-sectional view showing a semiconductor package according to some example embodiments.

In other embodiments, the redistribution substrate 400 may include more than two connection line layers. FIG. 4 illustrates a cross-sectional view showing a semiconductor package according to some example embodiments.

Referring to FIG. 4, the redistribution substrate 400 may further include a third connection line layer 800 between the first connection line layer 200 and the second connection line layer 300. The third connection line layer 800 may include a third conductive pattern 810, third vias 820, and a third dielectric layer 830.

The third conductive pattern 810 may be provided on the first connection line layer 200. The third conductive pattern 810 may include third pads 812 and third connection lines 814. Certain ones of the third pads 812 may be disposed on and coupled to the first vias 220. Each of the third pads 812 may have a width greater than a width of each of the first vias 220. The third connection lines 814 may be placed either between the third pads 812 or on sides of the third pads 812. The third connection lines 814 may serve as redistribution lines.

A fifth seed layer 816 may be provided between the third conductive pattern 810 and the first dielectric layer 230 and between the third conductive pattern 810 and the first via 220. For example, the fifth seed layer 816 may be provided on a bottom surface of the third conductive pattern 810.

The third vias 820 may be disposed on the third conductive pattern 810. For example, the third vias 820 may be disposed on a top surface of at least one of the third pads 812. The third vias 820 on the third pads 812 may be coupled to the second pads 312. The third vias 820 may have the same shape as the shape of the first vias 220. The third vias 820 may have their lateral surfaces perpendicular to a top surface of the third conductive pattern 810. Each of the third vias 820 may have a pillar shape whose width is uniform. The width of each of the third vias 820 may be about 2 μm to about 8 μm. A sixth seed layer 822 may be provided between the third conductive pattern 810 and each of the third vias 820. The sixth seed layer 822 may contact a bottom surface of the third via 820 and may not cover the lateral surfaces of the third via 820.

The third dielectric layer 830 may be provided on the first connection line layer 200. The third dielectric layer 830 may cover the third conductive pattern 810 and may surround the third vias 820. The third dielectric layer 830 may have a top surface coplanar with top surfaces 320c of the third vias 820. The third dielectric layer 830 may contact the lateral surfaces of the third vias 820 and lateral surfaces of the sixth seed layers 822. The third dielectric layer 830 may contact a bottom surface of the second connection line layer 300.

FIG. 4 shows the redistribution substrate 400 including three connection line layers 200, 300, and 800, but the present inventive concepts are not limited thereto. The redistribution substrate 400 may include more than three connection line layers.

According to the example embodiment shown in FIG. 4, because each of the first and third vias 220 and 820 has a pillar shape whose width is uniform, each of the first and third vias 220 and 820 may have a small width at its top surface, and the third pads 812 and the second pads 312 may be easily formed to have small widths on the first vias 220 and the third vias 820, respectively. A wider interval may be provided between the second pads 312 having narrow widths and between the third pads 812 having narrow widths, and thus a greater number of the second connection lines 314 may be disposed between the second pads 312 and likewise a greater number of the third connection lines 814 may be disposed between the third pads 812. For example, the redistribution substrate 400 may have a high density of the connection lines 314 and 814, and may have a smaller area used for forming the same number of the connection lines 314 and 814 rather than in related art cases.

Figure 5:
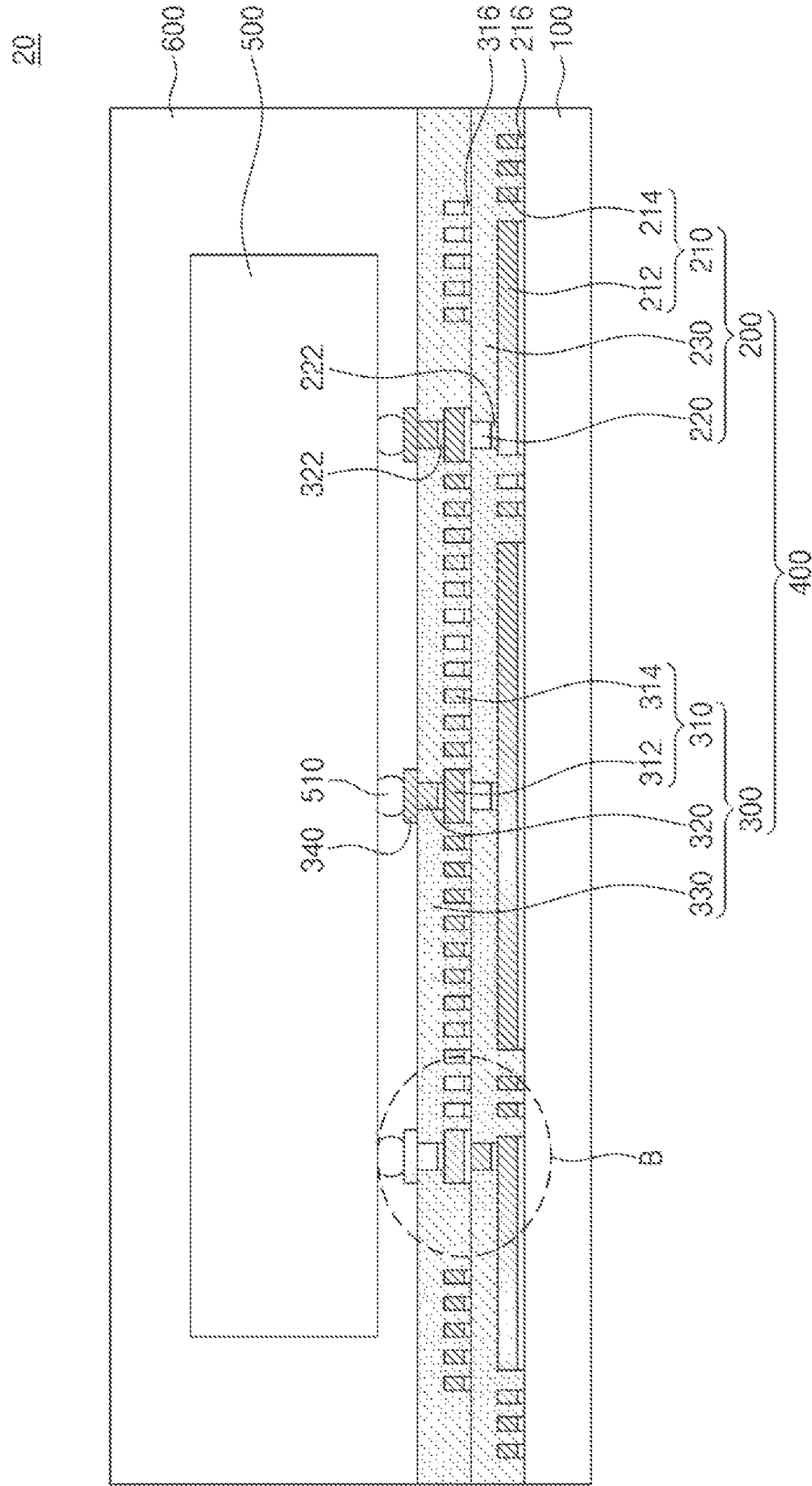
FIG. 5 illustrates a cross-sectional view showing a semiconductor package according to some example embodiments.
Figure 6:
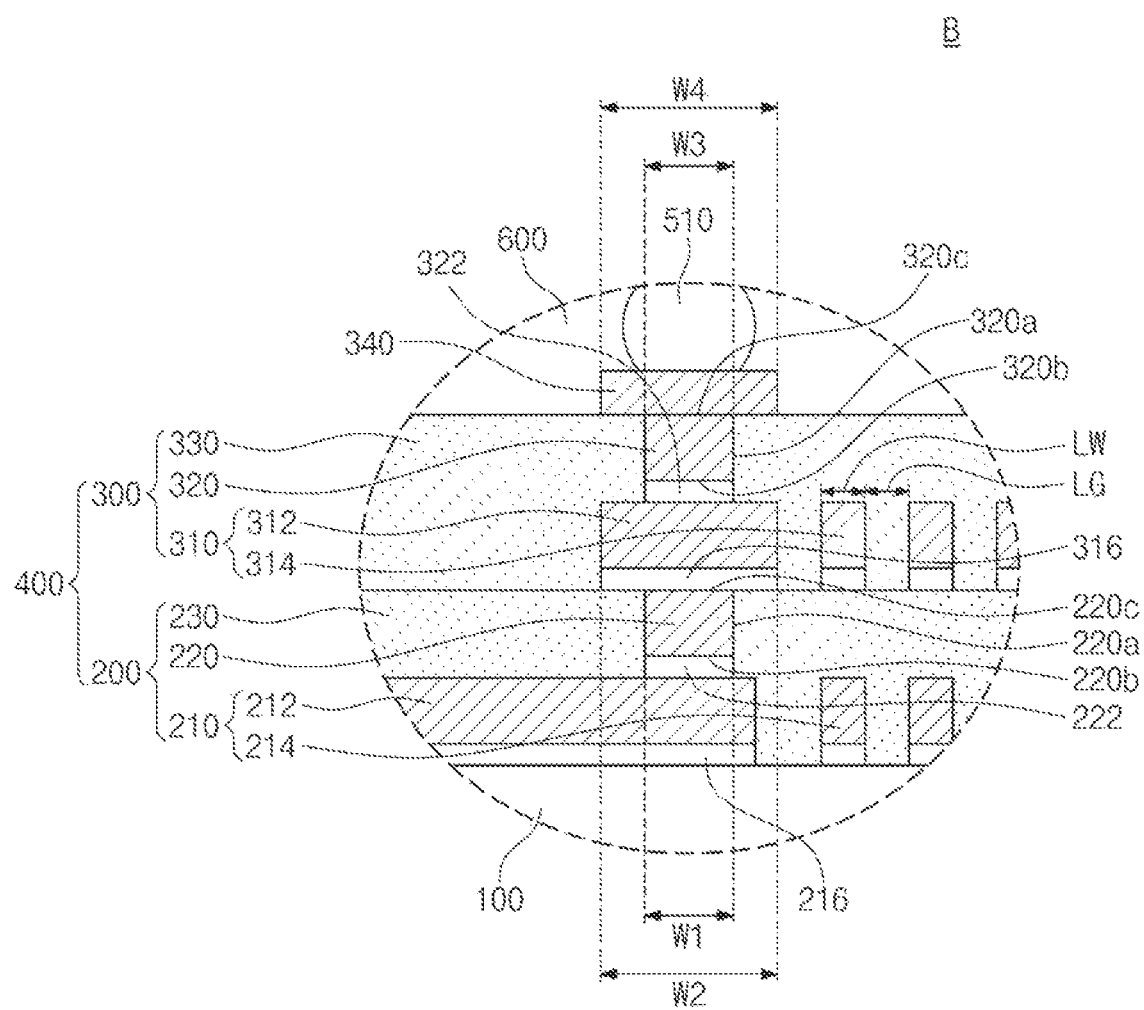
FIG. 6 illustrates an enlarged view showing a section B of the semiconductor package of FIG. 5.

FIG. 5 illustrates a cross-sectional view showing a semiconductor package according to some example embodiments. FIG. 6 illustrates an enlarged view showing section B of the semiconductor package of FIG. 5. In the embodiment that follows, some components of a semiconductor package shown in FIGS. 5 and 6 may be omitted for convenience of description. A duplicate explanation will be omitted for convenience of description.

Referring to FIGS. 5 and 6, a semiconductor package 20 according to some example embodiments may include a redistribution substrate 400, a semiconductor chip 500, and a molding layer 600.

The redistribution substrate 400 may be provided on a bottom surface of the semiconductor chip 500 and a bottom surface of the molding layer 600. The redistribution substrate 400 may include a first connection line layer 200 and a second connection line layer 300.

The first connection line layer 200 may be provided on a support substrate 100. The first connection line layer 200 may include a first conductive pattern 210, first vias 220, and a first dielectric layer 230.

The first conductive pattern 210 may be provided on the support substrate 100. The first conductive pattern 210 may include first pads 212 and first connection lines 214. The first connection lines 214 may be placed either between the first pads 212 or on sides of the first pads 212. A first seed layer 216 may be provided between the first conductive pattern 210 and the support substrate 100.

The first vias 220 may be disposed on the first conductive pattern 210. For example, the first vias 220 may be disposed on a top surface of at least one of the first pads 212. As shown in FIG. 6, the first vias 220 may have their lateral surfaces 220a perpendicular to a top surface of the first conductive pattern 210. Each of the first vias 220 may have a pillar shape whose width W1 is uniform. The first vias 220 may include a conductive material. A second seed layer 222 may be provided between the first conductive pattern 210 and each of the first vias 220. The second seed layer 222 may contact a bottom surface 220b of the first via 220, and may not cover the lateral surfaces 220a of the first via 220.

The first dielectric layer 230 may be provided on the support substrate 100. The first dielectric layer 230 may cover the first conductive pattern 210 and may surround the first vias 220. The first dielectric layer 230 may have a top surface coplanar with top surfaces 220c of the first vias 220. The first dielectric layer 230 may contact the lateral surfaces 220a of the first vias 220 and lateral surfaces of the second seed layers 222.

The second connection line layer 300 may be provided on the first connection line layer 200. The second connection line layer 300 may include a second conductive pattern 310, second vias 320, and a second dielectric layer 330.

The second conductive pattern 310 may be provided on the first connection line layer 200. The second conductive pattern 310 may include second pads 312 and second connection lines 314. Certain ones of the second pads 312 may be disposed on and coupled to the first vias 220. Each of the second pads 312 may have a width W2 greater than the width W1 of each of the first vias 220. The second connection lines 314 may be placed either between the second pads 312 or on sides of the second pads 312. The second connection lines 314 may serve as redistribution lines.

A third seed layer 316 may be provided between the second conductive pattern 310 and the first dielectric layer 230 and between the second conductive pattern 310 and the first via 220. For example, the third seed layer 316 may be provided on a bottom surface of the second conductive pattern 310.

The second vias 320 may be disposed on the second conductive pattern 310. For example, the second vias 320 may be disposed on a top surface of at least one of the second pads 312. The second vias 320 may have their lateral surfaces 320a perpendicular to a top surface of the second conductive pattern 310. Each of the second vias 320 may have a pillar shape whose width W3 is uniform. The width W3 of each of the second vias 320 may be about 2 μm to about 8 μm. For example, the width W3 of each of the second vias 320 may be about 5 μm.

A fourth seed layer 322 may be provided between the second conductive pattern 310 and each of the second vias 320. The fourth seed layer 322 may contact bottom surfaces 320b of the second vias 320, and may not cover the lateral surfaces 320a of the second vias 320.

The second dielectric layer 330 may be provided on the first connection line layer 200. The second dielectric layer 330 may cover the second conductive pattern 310 and may surround the second vias 320. The second dielectric layer 330 may have a top surface coplanar with top surfaces 320c of the second vias 320. The second dielectric layer 330 may contact the lateral surfaces 320a of the second vias 320 and lateral surfaces of the fourth seed layers 322.

Under bump pads 340 may be disposed on the second dielectric layer 330. The under bump pads 340 may contact the top surfaces 320c of the second vias 320 and the top surface of the second dielectric layer 330. Each of the under bump pads 340 may have a width W4 greater than the width W3 of each of the second vias 320. For example, the width W4 of each of the under bump pads 340 may be 1 to 2 times the width W3 of each of the second vias 320.

FIGS. 7 to 17 illustrate cross-sectional views showing a method of fabricating a redistribution substrate according to some example embodiments.

Figure 7:
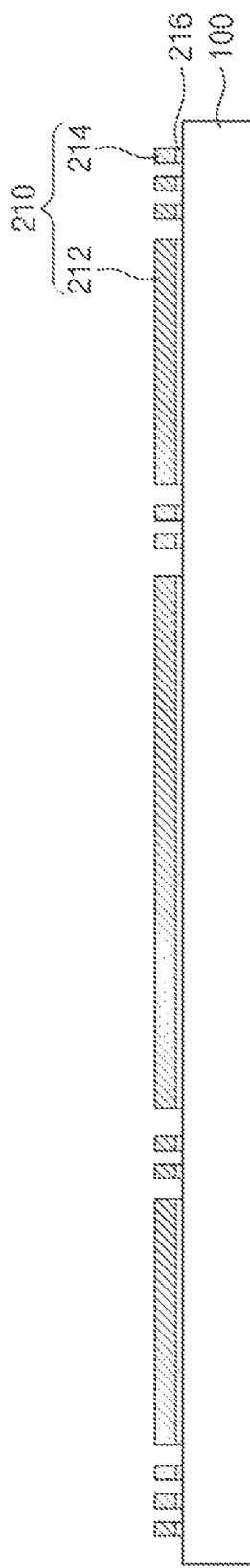

Referring to FIG. 7, a first conductive pattern 210 may be formed on a support substrate 100. For example, a first seed layer 216 may be formed on the support substrate 100, and then an etching mask having recesses may be formed on the first seed layer 216. The recesses may define an area in which the first conductive pattern 210 is formed. A plating process or the like may be performed to fill the recesses with a conductive material to form the first conductive pattern 210. Afterwards, the etching mask and a portion of the first seed layer 216 may be removed. The first seed layer 216 may remain between the first conductive pattern 210 and the support substrate 100. Alternatively, a conductive material may be deposited on the support substrate 100, and then patterned to form the first conductive pattern 210. The first conductive pattern 210 may include first pads 212 and first connection lines 214.

Figure 8:
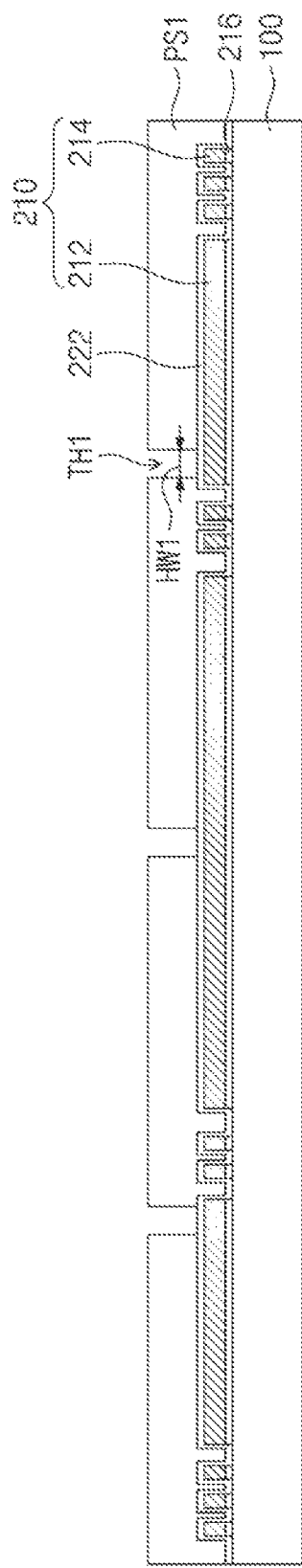

Referring to FIG. 8, a second seed layer 222 may be formed on the support substrate 100. The second seed layer 222 may be formed along a top surface of the support substrate 100 and along lateral and top surfaces of the first conductive pattern 210.

A first photosensitive layer PS1 may be formed on the support substrate 100. For example, the support substrate 100, the first conductive pattern 210, and the second seed layer 222 may be coated thereon with a photosensitive hardmask material to form the first photosensitive layer PS1.

The photosensitive hardmask material may include a resin, a photosensitive material, a cross-linking agent, and a solvent.

Thereafter, first through holes TH1 may be formed in the first photosensitive layer PS1. For example, an exposed portion the first photosensitive layer PS1 may be dissolved by a developing solution, and a non-exposed portion of the first photosensitive layer PS1 may not be dissolved by the developing solution. The first through holes TH1 may penetrate the first photosensitive layer PS1 and may expose a top surface of the second seed layer 222. The first through holes TH1 may be formed on the first pads 212. Each of the first through holes TH1 may be formed to have a pillar shape whose width HW1 is uniform. The width HW1 of each of the first through holes TH1 may be about 2 µm to about 8 nm.

Referring to FIG. 9, first vias 220 may be formed on the first conductive pattern 210. The first vias 220 may be formed by filling the first through holes TH1 with a conductive material. For example, a plating process may be performed in which the second seed layer 222 exposed by the first photosensitive layer PS1 may be used as a seed. The plating process may fill the first through holes TH1 with the conductive material. The plating process may continue before the conductive material protrudes outwardly from the first photosensitive layer PS1. Based on shapes of the first through holes TH1, each of the first vias 220 may be formed to have a pillar shape whose width is uniform.

In case a hardmask is used to form a via, the hardmask formed on a conductive pattern may be etched to form a through hole in which the via is formed. In this case, an upper portion of the hardmask may be lost when the hardmask is etched, and thus the through hole may be formed to have a lower portion and an upper portion wider than the lower portion. As a result, even though the lower portion of the through hole is formed to have a minimum width for coupling between the conductive pattern and the via, the upper portion of the through hole may be formed wider than the lower portion.

In contrast, according to the example embodiment shown in FIGS. 7-9, a process for forming the first through holes TH1 may include an exposure process performed on the first photosensitive layer PS1. In this case, the exposure process may change physical characteristics of portions of the first photosensitive layer PS1 that define areas where the first through holes TH1 are formed, and no over-etching may act on the first photosensitive layer PS1 except for the defined areas. As a result, each of the first through holes TH1 may be formed to have a vertically straight shape (e.g., a pillar shape whose width is uniform), and also formed to have a minimum width for coupling between the first conductive pattern 210 and the first via 220. In addition, according to the example embodiment shown in FIGS. 7-9, the first photosensitive layer PS1 on which the exposure process is performed may be used as a mold for the plating process, and accordingly it may be easy to form the first through holes TH1 each of whose widths is small.

Referring to FIG. 10, the first photosensitive layer PS1 may be removed. For example, the first photosensitive layer PS1 may be etched and removed, or dissolved.

After that, the second seed layer 222 may be partially removed. For example, a removal process may be performed on a portion of the second seed layer 222, which portion is exposed at the top surface of the support substrate 100 and at the lateral and top surfaces of the first conductive pattern 210. The second seed layer 222 may remain between each of the first pads 212 and each of the first vias 220.

Referring to FIG. 11, a first dielectric layer 230 may be formed on the support substrate 100. For example, the first dielectric layer 230 may be formed by coating or depositing an encapsulating material on the support substrate 100, the first conductive pattern 210, and the first vias 220. The first dielectric layer 230 may be formed using PECVD (Plasma Enhanced CVD), HDPCVD (High Density Plasma CVD), APCVD (Atmospheric Pressure CVD), spin coating, or the like. The first dielectric layer 230 may encapsulate the first conductive pattern 210 and the first vias 220. Optionally, if necessary, a curing process may be performed on the first dielectric layer 230.

Referring to FIG. 12, the grinding process may be performed on the first dielectric layer 230. The grinding process may continue until top surfaces of the first vias 220 are exposed at a top surface of the first dielectric layer 230. After the grinding process is performed, the top surface of the first dielectric layer 230 may be coplanar with the top surfaces of the first vias 220. Through the processes above, a first connection line layer 200 may be formed on the support substrate 100.

Figure 13:
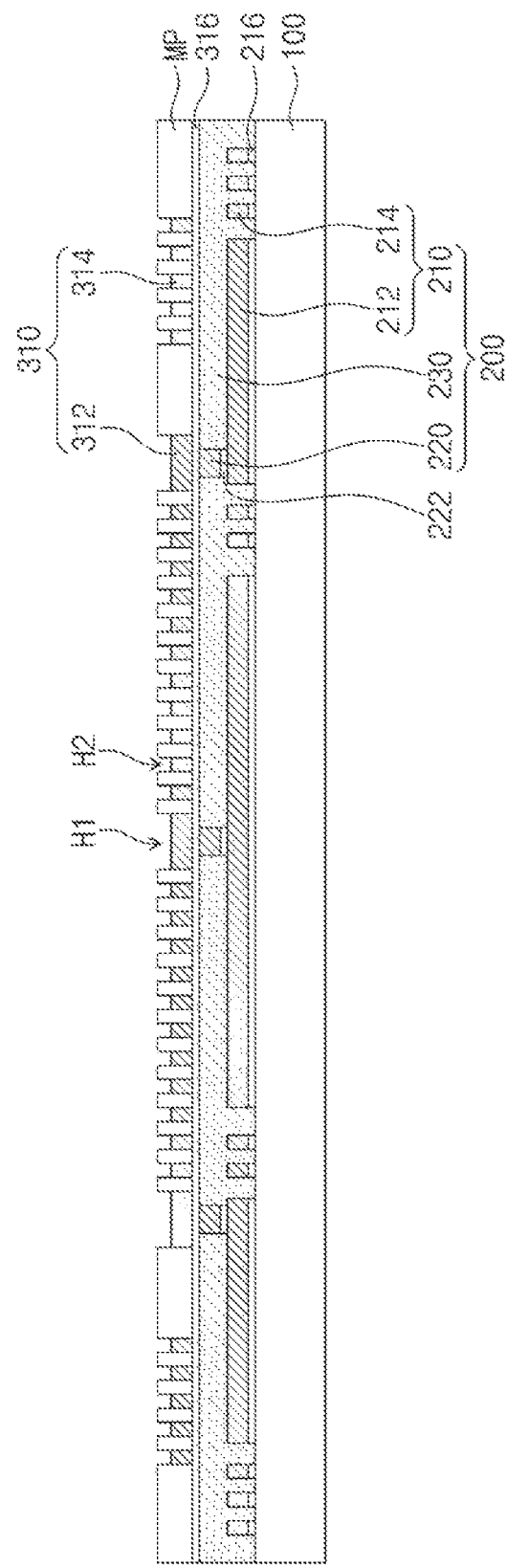

Referring to FIG. 13, a second conductive pattern 310 may be formed on the first connection line layer 200. For example, a third seed layer 316 may be formed on the first dielectric layer 230. The third seed layer 316 may cover the first dielectric layer 230.

A mask pattern MP may be formed on the third seed layer 316. The mask pattern MP may have first holes H1 exposing the first vias 220 and second holes H2 spaced apart from the first holes H1. The first holes H1 may define areas in which are formed second pads 312 which will be discussed below, and the second holes H2 may define areas in which are formed second connection lines 314 which will be discussed below. The first hole H1 may have a planar shape the same as or larger than that of the first via 220. The first hole H1 may have a width 1 to 2 times the width (see HW1 of FIG. 8) of each of the first through holes TH1. The width of the first hole H1 may be about 2 µm to about 15 µm. The second holes H2 may be formed between the first holes H1. The second holes H2 may each have a width of about 1 µm to about 3 µm, and may be spaced apart from each other at an interval of about 1 µm to about 3 µm.

A plating process or the like may be performed to fill the first holes H1 and the second holes H2 with a conductive material to form the second conductive pattern 310 that includes second pads 312 and second connection lines 314. Based on a shape of the first hole H1, each of the second pads 312 may be formed to have a width of about 2 µm to about 15 µm. Alternatively, a conductive material may be deposited on the first dielectric layer 230, and then patterned to form the second conductive pattern 310. The second pads 312 may be formed on the first vias 220, and the second connection lines 314 may be formed between the second pads 312.

Each of the second pads 312 may be formed to have a width the same as or greater than that of each of the first vias 220. According to the example embodiment shown in FIGS. 7-13, the first vias 220 may be formed in the first through holes (see TH1 of FIG. 9) whose upper and lower portions have the same width, and the first vias 220 may be easily formed to have upper portions whose widths are small. Accordingly, the second pads 312 may also have small widths on the first vias 220. In addition, the second pads 312 may be separately formed after the first vias 220 are formed, and thus it may be easy to form the second pads 312 whose sizes are small. Therefore, a wider interval may be provided between the second pads 312, and a greater number of the second connection lines 314 may be provided between the second pads 312. As a result, it may be possible to fabricate a semiconductor package having increased integration and reduced size as compared to the related art case.

On the other hand, when the first vias 220 are formed to have upper portions wider than lower portions as in the related art, the widths of the second pads 312 may be increased to decrease an interval between the second pads 312, and thus a small number of the second connection lines 314 may be formed between the second pads 312.

Figure 14:
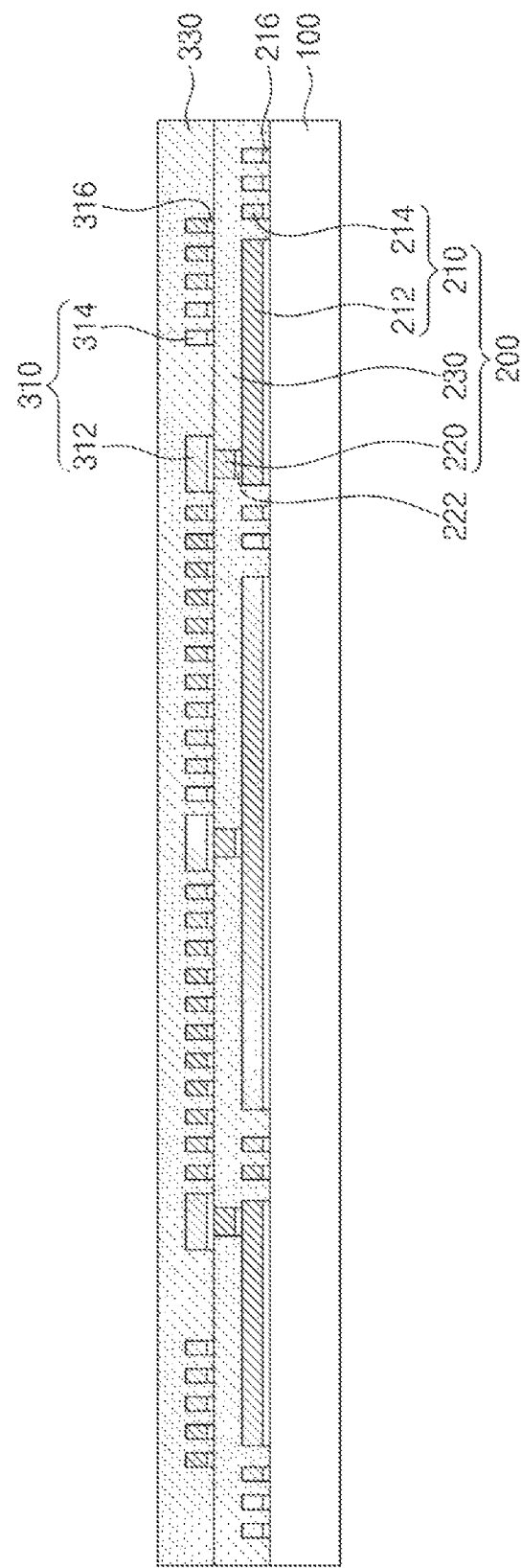

Referring to FIG. 14, the mask pattern MP may be removed, and a portion of the third seed layer 316 may be removed. The third seed layer 316 may remain between each of the first vias 220 and each of the second pads 312 and between the first dielectric layer 230 and each of the second connection lines 314.

A second dielectric layer 330 may be formed on the first connection line layer 200. For example, the second dielectric layer 330 may be formed by coating or depositing an encapsulating material on the first dielectric layer 230 and the second conductive pattern 310. The second dielectric layer 330 may be formed using PECVD (Plasma Enhanced CVD), HDPCVD (High Density Plasma CVD), APCVD (Atmospheric Pressure CVD), spin coating, or the like. The second dielectric layer 330 may encapsulate the second conductive pattern 310. Optionally, a curing process may be performed on the second dielectric layer 330.

Figure 15:
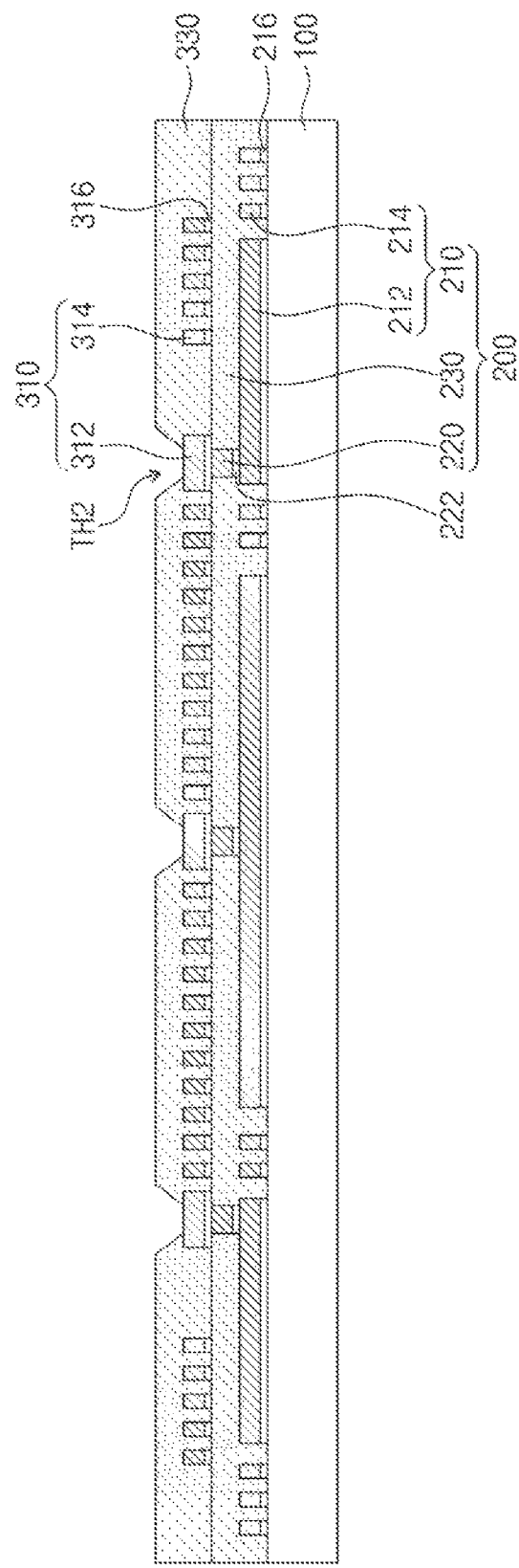

Referring to FIG. 15, second through holes TH2 may be formed in the second dielectric layer 330. For example, the second dielectric layer 330 may undergo an etching process to form the second through holes TH2. The etching process may over-etch an upper portion of the second dielectric layer 330, and thus each of the second through holes TH2 may have a tapered shape whose width increases with increasing distance from the second conductive pattern 310. The second through holes TH2 may penetrate the second dielectric layer 330 and may expose top surface of the second pads 312. Each of the second through holes TH2 may have a top end whose width is 2 to 4 times a width of a bottom end thereof. The width of the bottom end of the second through hole TH2 may be the same as or greater than the width (see HW1 of FIG. 8) of the first through hole TH1. The width of the bottom end of the second through hole TH2 may be about 2 µm to about 8 µm. The second through holes TH2 may define areas in which are formed second vias 320 which will be discussed below.

Figure 16:
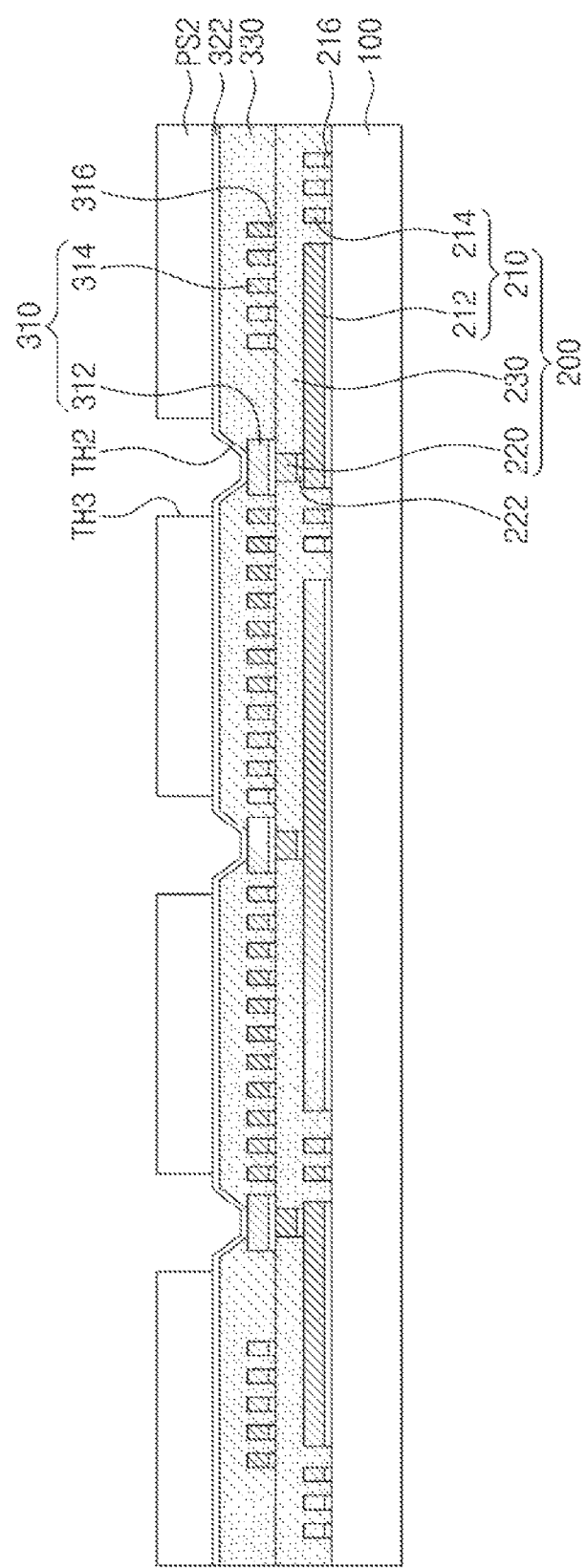

Referring to FIG. 16, a fourth seed layer 322 may be formed on the second dielectric layer 330. The fourth seed layer 322 may be formed along a top surface of the second dielectric layer 330 and along bottom surfaces and inner walls of the second through holes TH2.

A second photosensitive layer PS2 may be formed on the second dielectric layer 330. For example, the second sensitive layer PS2 may be formed by coating a photosensitive material on the fourth seed layer 322. Afterwards, third through holes TH3 may be formed in the second photosensitive layer PS2. The third through holes TH3 may be formed on the second through holes TH2. For example, the third through holes TH3 of the second photosensitive layer PS2 may be spatially connected to the second through holes TH2 of the second dielectric layer 330. The third through holes TH3 may expose a top surface of the fourth seed layer 322. The third through holes TH3 may define areas in which are formed under bump pads 340 which will be discussed below. Each of the third through holes TH3 may have a planar shape the same as or larger than a planar shape of each of the second through holes TH2. Each of the third through holes TH3 may have a width 1 to 2 times the width of each of the second through holes TH2.

Figure 17:
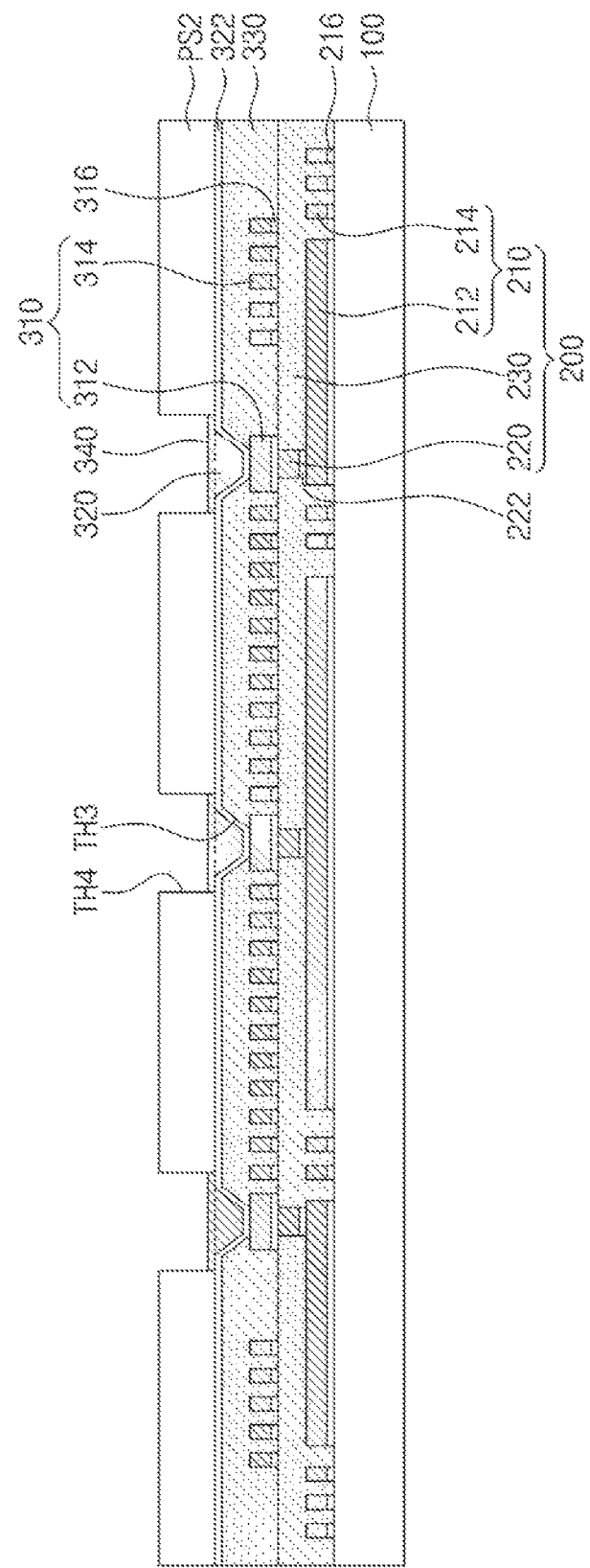

Referring to FIG. 17, second vias 320 and under bump pads 340 may be formed on the second pads 312. The second vias 320 may be formed by filling the second through holes TH2 with a conductive material. For example, the fourth seed layer 322 exposed to the second through holes TH2 may be used as a seed to perform a plating process to fill the second through holes TH2 with the conductive material. Based on a shape of each of the second through holes TH2, each of the second vias 320 may be formed to have a tapered shape whose width increases with increasing distance from the second conductive pattern 310. The under bump pads 340 may be formed by filling the third through holes TH3 with a conductive material. For example, the second vias 320 exposed to the third through holes TH3 may be used as a seed to perform a plating process to fill the third through holes TH3 with the conductive material. Although the process for forming the second vias 320 and the process for forming the under bump pads 340 are described separately from each other, the process for forming the second vias 320 and the process for forming the under bump pads 340 may be successively performed, and the second via 320 and the under bump pad 340 may be integrally formed into a single body. In other embodiments, after the second vias 320 are formed, a separate process may be performed to form the under bump pads 340. Through the processes above, a second connection line layer 300 may be formed on the first connection line layer 200.

Thereafter, the second photosensitive layer PS2 may be removed to fabricate a redistribution substrate 400.

Referring back to FIG. 1, a semiconductor chip 500 may be mounted on the redistribution substrate 400. For example, the semiconductor chip 500 may be flip-chip bonded to the under bump pads 340 of the redistribution substrate 400.

A molding layer 600 may be formed on the redistribution substrate 400. For example, the redistribution substrate 400 may be supplied thereon with a dielectric material to cover the semiconductor chip 500. The processes above may fabricate a semiconductor package 10 of FIG. 1.

In other embodiments, a process may further be performed to form external terminals 730 on the semiconductor package 10 of FIG. 1. Referring to FIG. 3, the support substrate 100 may be removed to expose a bottom surface of the redistribution substrate 400. A passivation layer 700 may be formed below the redistribution substrate 400. For example, the redistribution substrate 400 may be provided on its bottom surface with an organic material, an inorganic material, an ajinomoto build-up film (ABF), or a dielectric polymer such as an epoxy-based polymer, which may result in the formation of the passivation layer 700. Thereafter, grooves exposing the first pads 212 may be formed in the passivation layer 700, and then filled with a conductive material to form metal layers 720 and external pads 710. The external pads 710 may be provided thereon with the external terminals 730 such as solder balls or solder bumps, with the result that a semiconductor package may be fabricated as shown in FIG. 3.

According to some example embodiments, because a redistribution substrate includes pads each of which has a narrow width, a wide interval may be provided between the pads, and accordingly a greater number of connection lines may be disposed between the pads. Thus, the redistribution substrate may have a high density of the connection lines for redistribution, and may have a smaller area used to form the same number of the connection lines rather than in related art cases. As a result, it may be possible to provide a compact-sized semiconductor package.

In a method of fabricating a semiconductor package according to some example embodiments, vias may be formed to have small widths, and therefore pads formed on the vias may also have small widths. It may thus be easy to form small-sized pads. Accordingly, a wider interval may be provided between the pads, and a greater number of connection lines may be formed between the pads than in the related art case. As a result, it may be possible to fabricate a semiconductor package having increased integration and reduced size as compared to the related art case.

Although the present inventive concept has been described in connection with the some example embodiments illustrated in the accompanying drawings, it will be understood by one of ordinary skill in the art that variations in form and detail may be made therein without departing from the spirit and essential feature of the present inventive concepts as provided in the appended claims. The above disclosed embodiments should thus be considered illustrative and not restrictive.

What is claimed is:

1. A redistribution substrate comprising:
   a first conductive pattern;
   a first seed layer on a bottom surface of the first conductive pattern;
   a first via connected to a top surface of the first conductive pattern, the top surface of the first conductive pattern and a lateral surface of the first via are substantially perpendicular;
   a second seed layer between the first via and the first conductive pattern;
   a first dielectric layer that encapsulates the first conductive pattern and the first via, a top surface of the first dielectric layer being coplanar with a top surface of the first via;
   a second conductive pattern on the top surface of the first via;
   a third seed layer on a bottom surface of the second conductive pattern;
   a second via connected to a top surface of the second conductive pattern, the top surface of the second conductive pattern and a lateral surface of the second via are substantially perpendicular;
   a fourth seed layer between the second via and the second conductive pattern; and
   a second dielectric layer that encapsulates the second conductive pattern and the second via on the first dielectric layer.

2. The redistribution substrate of claim 1, further comprising an under bump pad on the second via,
   wherein a width of the under bump pad is greater than a width of a top surface of the second via and a third width of the second conductive pattern.

3. The redistribution substrate of claim 2, wherein the width of the under bump pad is about 1.5 to 3 times the width of the top surface of the second via.

4. The redistribution substrate of claim 1, wherein the first dielectric layer is in direct contact with the lateral surface of the first via.

5. The redistribution substrate of claim 1, wherein
   the first via has a pillar shape whose first via width is uniform, and
   the second via has a pillar shape whose first via width is uniform.

6. The redistribution substrate of claim 1, wherein a first width of the second conductive pattern is 1 to 2 times a second width of the first conductive pattern.

7. The redistribution substrate of claim 1, wherein a first width of the top surface of the first via is equal to or less than a second width of a bottom surface of the second via.

8. The redistribution substrate of claim 1, wherein the second conductive pattern including:
   a second conductive pattern pad connected to the first via; and
   a plurality of connection lines spaced apart from the second conductive pattern pad,
   wherein the plurality of connection lines have a width of 1 μm to 3 μm and are spaced apart from each other at an interval of 1 μm to 3 μm.

9. A redistribution substrate comprising:
   a first conductive pattern;
   a first via connected to a top surface of the first conductive pattern;
   a first dielectric layer that encapsulates the first conductive pattern and the first via, a top surface of the first dielectric layer being coplanar with a top surface of the first via;
   a second conductive pattern on the top surface of the first via, wherein the second conductive pattern including:
      a second conductive pattern pad connected to the first via, and
      a plurality of connection lines spaced apart from the second conductive pattern pad;
   a second via connected to a top surface of the second conductive pattern pad; and
   a second dielectric layer that encapsulates the second conductive pattern and the second via on the first dielectric layer,
   wherein a lateral surface of the first via is perpendicular to the top surface of the first conductive pattern, and
   wherein a lateral surface of the second via is inclined with respect to the top surface of the second conductive pattern pad.

10. The redistribution substrate of claim 9, further comprising:
    a first seed layer between the first via and the first conductive pattern; and
    a second seed layer between the second via and the second conductive pattern pad.

11. The redistribution substrate of claim 10, further comprising an under bump pad on the second via,
    wherein the second seed layer extends between the second dielectric layer and the second via and between the second dielectric layer and the under bump pad.

12. The redistribution substrate of claim 11, wherein a width of the under bump pad is about 1.5 to 3 times a width of a top surface of the second via.

13. The redistribution substrate of claim 9, wherein the first dielectric layer is in direct contact with the lateral surface of the first via.

14. The redistribution substrate of claim 9, wherein
    the first via has a pillar shape whose first via width is uniform, and
    the second via has a tapered shape whose second via width increases with increasing distance from the second conductive pattern pad.

15. The redistribution substrate of claim 9, wherein a width of the second conductive pattern pad is 1 to 2 times a width of the first conductive pattern.

16. The redistribution substrate of claim 9, wherein a width of the top surface of the first via is equal to or less than a width of a bottom surface of the second via.

17. The redistribution substrate of claim 9, wherein the plurality of connection lines have a width of 1 μm to 3 μm and are spaced apart from each other at an interval of 1 μm to 3 μm.

18. A redistribution substrate comprising:
a first conductive pattern;
a first via connected to a top surface of the first conductive pattern, the top surface of the first conductive pattern and a lateral surface of the first via are substantially perpendicular;
a first dielectric layer that encapsulates the first conductive pattern and the first via;
a second conductive pattern on the top surface of the first via, the second conductive pattern including:
a second conductive pattern pad connected to the first via, and
a plurality of connection lines spaced apart from the second conductive pattern pad;
a second via connected to a top surface of the second conductive pattern pad, the top surface of the second conductive pattern pad and a lateral surface of the second via are substantially perpendicular;
a second dielectric layer that encapsulates the second conductive pattern and the second via on the first dielectric layer; and
an under bump pad on the second via,
wherein the first dielectric layer is in direct contact with the lateral surface of the first via.

19. The redistribution substrate of claim 18, further comprising:
a first seed layer between the first via and the first conductive pattern; and
a second seed layer between the second via and the second conductive pattern pad,
wherein the second seed layer extends between the second dielectric layer and the second via and between the second dielectric layer and the under bump pad.

20. The redistribution substrate of claim 18, wherein a first width of the second conductive pattern pad is 1 to 2 times a second width of the first conductive pattern.

* * * * *